United States Patent
Meister et al.

(10) Patent No.: US 7,449,389 B2
(45) Date of Patent: Nov. 11, 2008

(54) METHOD FOR FABRICATING A SEMICONDUCTOR STRUCTURE

(75) Inventors: Thomas Meister, Taufkirchen (DE);
Herbert Schäfer, Höhenkirchen-Siegertsbrunn (DE); Josef Böck, Munich (DE); Rudolf Lachner, Ingolstadt (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/553,704

(22) Filed: Oct. 27, 2006

(65) Prior Publication Data

US 2008/0102593 A1    May 1, 2008

(51) Int. Cl.
*H01L 21/20* (2006.01)
(52) U.S. Cl. .................. 438/379; 438/340; 438/328; 438/202; 257/E21.364; 257/E29.344
(58) Field of Classification Search ................. 438/379, 438/340, 329, 202, 309, 357, 369; 257/566, 257/565, 577, E27.049, E29.344
See application file for complete search history.

(56) References Cited

U.S. PATENT DOCUMENTS

| | | | | |
|---|---|---|---|---|
| 5,021,859 A | * | 6/1991 | Ito et al. | 257/370 |
| 5,405,790 A | * | 4/1995 | Rahim et al. | 438/202 |
| 5,929,802 A | | 7/1999 | Russell et al. | |
| 6,806,555 B2 | * | 10/2004 | Huber et al. | 257/566 |
| 7,064,416 B2 | * | 6/2006 | Dunn et al. | 257/566 |
| 7,242,071 B1 | * | 7/2007 | Liu et al. | 257/510 |
| 7,282,771 B2 | * | 10/2007 | Voldman | 257/372 |
| 2002/0173092 A1 | * | 11/2002 | Yamaguchi et al. | 438/205 |
| 2004/0198013 A1 | * | 10/2004 | Johansson | 438/329 |
| 2007/0096257 A1 | * | 5/2007 | Coolbaugh et al. | 257/565 |

FOREIGN PATENT DOCUMENTS

| WO | 04040643 | 5/2004 |
|---|---|---|
| WO | 03063255 | 1/2005 |

* cited by examiner

*Primary Examiner*—Brook Kebede
*Assistant Examiner*—Shaka Scarlett
(74) *Attorney, Agent, or Firm*—Dicke, Billig & Czaja, PLLC

(57) ABSTRACT

A method for fabricating a semiconductor including defining a first component region and a second component region in a semiconductor body is provided. A first epitaxial layer is formed through the first component region. A second epitaxial layer is formed over the first epitaxial layer, including configuring the physical dimensions of a first active zone of the first component region independent of a second active zone of the second component region via the first epitaxial layer and the second epitaxial layer. In one embodiment, the first component is a radio-frequency transistor and the second component is a varactor.

16 Claims, 15 Drawing Sheets

METHOD FOR FABRICATING A SEMICONDUCTOR STRUCTURE

CROSS REFERENCE TO RELATED APPLICATION

This Utility Patent Application claims priority to German Patent Application No. DE 10 2006 046 727.2 filed on Oct. 2, 2006, which is incorporated herein by reference.

TECHNICAL FIELD

The invention relates to a method for fabricating active component zones of varactors and radio-frequency transistors in a common semiconductor substrate. The active component zones are, for example, collector zones of the transistors or cathode zones of the varactors or capacitance diodes.

BACKGROUND

The practice of integrating capacitance diodes (varactors) and bipolar transistors in a common semiconductor body is important, in particular, when fabricating voltage-controlled oscillators (VCOs). Fields of application of voltage-controlled oscillators (VCOs) which are usually fabricated using bipolar or BICMOS technologies are, for example, mobile radio at frequencies of around 900 MHz to 2.4 GHz and radar technology at frequencies of around 24 GHz. Another application is, for example, a distance radar apparatus for use in automobiles in a frequency band from 76 GHz to 81 GHz. A transmission signal for such radar instruments is generated by a voltage-controlled oscillator. Known distance radar instruments are implemented using expensive III/V semiconductor technologies on account of the high transmission frequencies required. Recently, however, it has been possible to significantly improve the performance of SiGe heterojunction bipolar transistors (SiGe HJBT), with the result that silicon-based bipolar and BICMOS technologies which have cut-off and oscillation frequencies of 200 GHz are also suitable, in principle, for implementing an automotive distance radar apparatus using the above-mentioned frequency range of 76 GHz to 81 GHz.

The implementation of such radar instruments requires microwave-frequency transistors having a transition frequency of more than 200 GHz and suitable varactors to be integrated in a common semiconductor substrate.

The collector of a bipolar transistor, for example an NPN radio-frequency transistor, is fabricated, in known methods, using a silicon epitaxial layer on a highly doped buried $n^+$-type layer (subcollector). In this case, the width of the collector is determined by the thickness of the silicon epitaxial layer. In comparison with older slower transistors, a modern bipolar transistor having a transition frequency of more than 200 GHz requires a very flat collector, that is to say a very thin silicon epitaxial layer, in order to achieve these high cut-off frequencies. However, when using conventional fabrication methods to integrate the above-mentioned components (radio-frequency transistors, varactors and high-voltage transistors), a thin epitaxial layer limits, on the one hand, the emitter-collector and base-collector breakdown voltages of the high-voltage transistors and, in particular, also the capacitance range in which the varactor can be varied. An important characteristic variable for characterizing this range is the $C_{max}/C_{min}$ ratio, that is to say the ratio between the maximum achievable capacitance of the varactor and the minimum achievable capacitance. The greatest possible frequency range in which a VCO constructed with the aid of the varactor can oscillate presupposes a correspondingly large $C_{max}/C_{min}$ ratio of the varactor. A bandwidth of the VCO of 12 GHz or more is desirable for expedient use in an automotive distance radar apparatus.

When integrating transistors and varactors in a common semiconductor substrate using the same fabrication process some conflicts of objectives emerge: in order to achieve the highest possible transition frequency in the case of radio-frequency and microwave-frequency bipolar transistors, the epitaxial layer which determines the collector width must be very thin. In the case of varactors, the thickness of the epitaxial layer determines the width of the cathode zone in which the space charge zone propagates, on which the achievable capacitance depends directly. A very thin cathode zone would greatly reduce the achievable $C_{max}/C_{min}$ ratio, and thus the achievable bandwidth of a VCO constructed with the aid of the varactor would thus be greatly restricted.

There is a similar conflict of objectives when additionally integrating high-voltage bipolar transistors. In order to achieve the requisite electric strength (i.e. withstand voltage), the epitaxial layer would have to be selected to be considerably thicker than in a radio-frequency transistor in order to increase the collector width and thus to increase the electric strength of the collector zone.

For these and other reasons, there is a need for the present invention.

SUMMARY

One embodiment provides a method for fabricating a semiconductor including defining a first component region and a second component region in a semiconductor body. A first epitaxial layer is formed through the first component region. A second epitaxial layer is formed over the first epitaxial layer, including configuring the physical dimensions of a first active zone of the first component region independent of a second active zone of the second component region via the first epitaxial layer and the second epitaxial layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
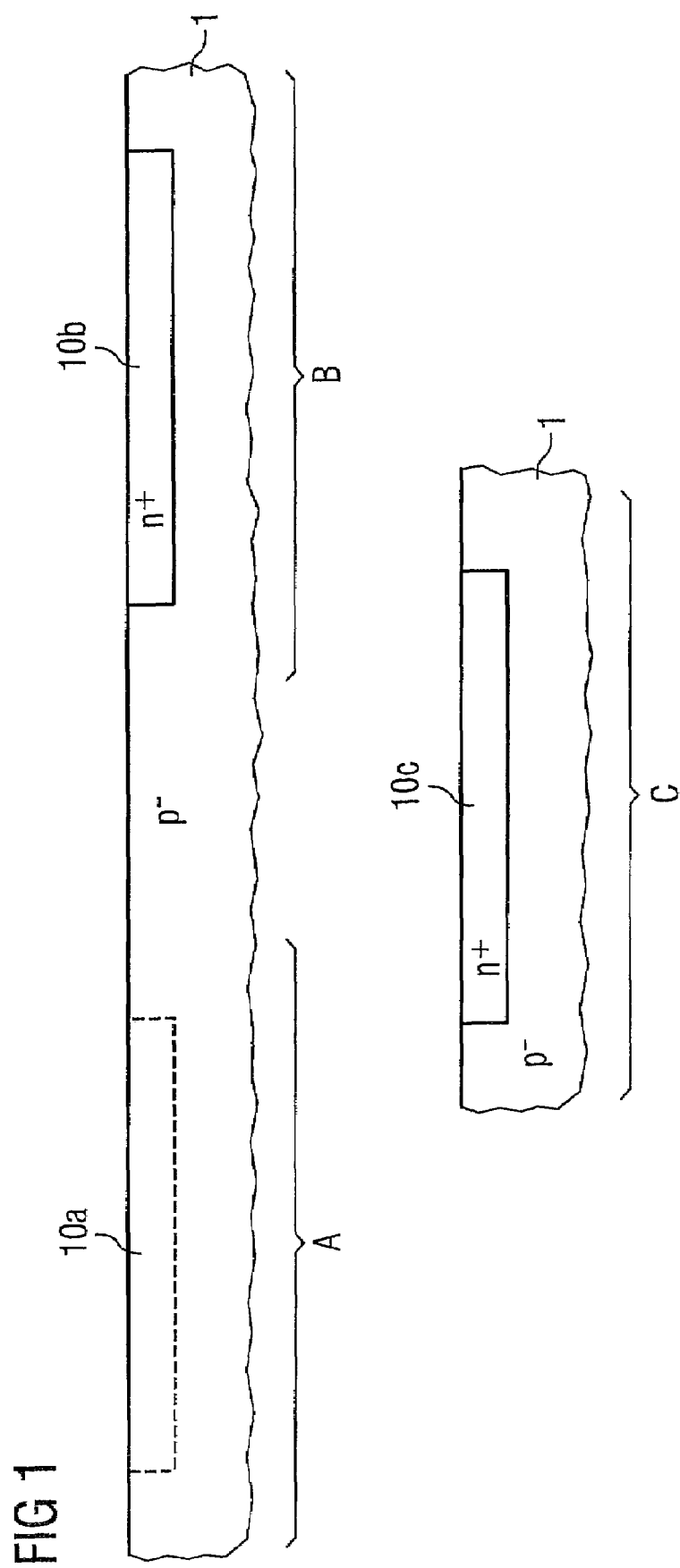
FIG. 1 illustrates a weakly doped semiconductor substrate having highly doped connection zones.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a method for fabricating component zones of different vertical width of at least one radio-frequency transistor, which is arranged in a first component region of a semiconductor substrate, and of a varactor, which is arranged in a second component region of the semiconductor substrate. One embodiment of the invention is to use a dual epitaxial concept which makes it possible to jointly integrate radio-frequency transistors and varactors (capacitance diodes) and thus makes it possible to fabricate an integrated radio-frequency VCO.

In this method, after a semiconductor substrate has been provided, a first highly doped connection zone which is used as a cathode connection zone for the capacitance diode is fabricated in a second component region. A first semiconductor layer which is in the form of an epitaxial layer, for example, is then deposited on the semiconductor substrate, thus "burying" the first highly doped connection zone. A second highly doped connection zone is then fabricated in this epitaxial layer in the first component region. This second highly doped connection zone forms a subcollector for the radio-frequency transistor. A third highly doped connection zone which is at least partially arranged above the first highly doped connection zone may also be fabricated in the second component region in the same method process. However, it is also possible for this third highly doped connection zone to be fabricated in a subsequent process. This third connection zone can be used to electrically contact the buried first highly doped connection zone.

A second epitaxial layer is then deposited on the first epitaxial layer. Depositing the two epitaxial layers "buries" the first highly doped connection zone, the second highly doped connection zone and the third highly doped connection zone in the semiconductor body. The first and second buried highly doped connection zones are then at different vertical distances from the surface of the semiconductor body. The third highly doped connection zone is in the same horizontal plane as the second highly doped connection zone and is used merely to contact the first highly doped connection zone.

In further method processes, dopants are implanted in the two epitaxial layers in the second component region in order to fabricate a cathode zone of the varactor. In this case, the cathode zone extends, in a vertical direction, over the two epitaxial layers and extends as far as the first highly doped connection zone. Dopants are implanted in the second epitaxial layer in the first component region in order to form a collector zone of the radio-frequency transistor. The active zone of the first component extends merely over the second epitaxial layer in a vertical direction and extends as far as the second highly doped connection zone.

The dual epitaxial concept explained makes it possible to set the physical dimensions of the active component zones (i.e. the cathode zones and the collector zones) of the radio-frequency transistor and of the varactor completely independently of one another. The spatial extent of the collector zone of the radio-frequency transistor in the vertical direction is determined only by the thickness of the second epitaxial layer, whereas the spatial extent of the cathode zone of the varactor in the vertical direction is determined by the sum of the thicknesses of the first epitaxial layer and of the second epitaxial layer. This makes it possible, for example, for the transition frequency of the radio-frequency transistor, which decreases as the width of the collector zone increases, and for the $C_{max}/C_{min}$ ratio of the varactor (and thus indirectly the bandwidth of the VCO implemented with the aid of the varactor) to thus be set completely independently of one another.

The second highly doped connection zone may not only be arranged in the first epitaxial layer but may also extend into the substrate, thus achieving a considerably lower connection resistance. To this end, the second highly doped connection zone is implanted not only in the first epitaxial layer but also (at the same time as the first highly doped connection zone) in the semiconductor substrate.

In one embodiment of the invention, component zones of a high-voltage transistor which is arranged in a third component region are fabricated at the same time as the component zones of the radio-frequency transistor and of the varactor. Thus, for example, a fourth highly doped connection zone is fabricated as a subcollector in the third component region in the semiconductor substrate in the same method step in which the first highly doped connection zone is fabricated. After the first epitaxial layer has been deposited, a fifth highly doped connection zone which is at least partially arranged above the fourth connection zone in the third component region is also fabricated at the same time as the third highly doped connection zone. The single additional method step needed to fabricate the high-voltage transistor is to implant dopants in the third component region in order to form a collector zone of the high-voltage transistor, which collector zone extends, in a vertical direction, as far as the fourth highly doped connection zone. Like the cathode width in the varactor, the collector width of the high-voltage transistor is also determined by the sum of the deposition thicknesses of the two epitaxial layers. As a result, the electric strength of the high-voltage transistor is considerably higher than that of the radio-frequency transistor.

The dual epitaxial concept explained above makes it possible for the collector width of the radio-frequency transistor and the collector width of the high-voltage transistor to be set independently of one another. In order to achieve the highest possible transition frequency of the radio-frequency transistor a collector width which is relatively small in comparison with the high-voltage transistor is required, whereas, in the high-voltage transistor, the collector width must be relatively large in order to achieve the electric strength required. As in the case of the high-voltage transistor, the thickness of the cathode zone of the varactor is determined by the sum of the thicknesses of the two epitaxial layers, which also determines the distance between the diode pn junction and the cathode connection zone. The thickness of the cathode zone in turn has a considerable influence on the size of the range in which the capacitance of the varactor can be varied.

Capacitance diodes are needed to implement a voltage-controlled oscillator. The fabrication method makes it possible for radio-frequency transistors and microwave-frequency transistors to be integrated in a semiconductor body, in a joint fabrication process, at the same time as high-voltage transistors, for example for the ESD protective structures required, and at the same time as capacitance diodes which are needed to implement voltage-controlled oscillators (VCOs).

The fabrication method explained constitutes a key technology for implementing modern radar distance-measuring instruments in the 76 GHz-81 GHz range for use in automotive applications, for example. It makes it possible to implement a voltage-controlled oscillator, which can be tuned in a wide range, on the basis of radio-frequency transistors and varactors using cost-effective and large-scale integrable SiGe bipolar technology. In comparison with the previous GaAs semiconductor solutions which were much too expensive, these cost advantages are a basic prerequisite for automobile radar sensors to penetrate the market to a significant extent.

The process of fabricating a semiconductor chip having a radio-frequency transistor Thf, a high-voltage transistor Thv and a capacitance diode Dv using the dual epitaxial concept will be explained below with reference to the figures. In this case, the collector width of the radio-frequency transistor can be set independently of the collector width of the high-voltage transistor and independently of the distance between the pn junction of the capacitance diode and the substrate.

FIG. 1 illustrates the result of a first method step. After a semiconductor substrate 1 which is weakly p-doped (p⁻-doped), for example, has been provided, a highly n-doped (n⁺-doped) fourth connection zone 10b is fabricated in a component region B of the high-voltage transistor and a highly n-doped first connection zone 10c is fabricated in a component region C of the capacitance diode in the semiconductor substrate 1. This is effected, for example, by applying a photomask to the semiconductor substrate and by implanting arsenic, for example with a dose of $7 \cdot 10^{15}$ cm$^{-2}$, in the semiconductor substrate 1 using openings in the mask. This layer is used, in the component region B of the high-voltage transistor, as a subcollector for connecting the collector zone and is used, in the component region C of the capacitance diode, to connect the cathode zone. Optionally, a highly doped sixth connection zone 10a (illustrated using dashed lines) which forms part of the subcollector of the radio-frequency transistor can also be implanted in a component region A of the radio-frequency transistor. The photoresist is then removed and the substrate is subjected to a thermal treatment at a temperature of 1050° C., for example, in order to heal implantation damage and activate the dopants.

Figure 2:
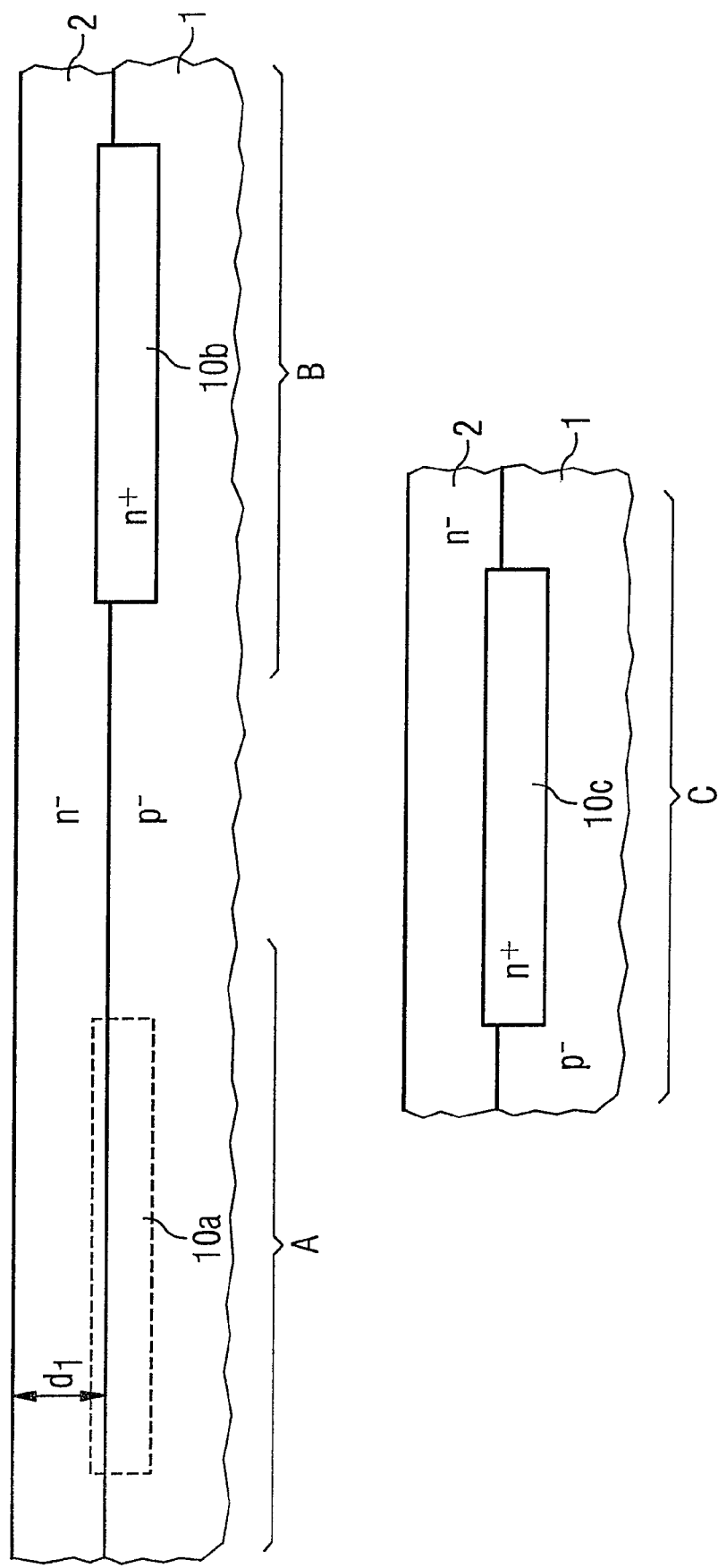
FIG. 2 illustrates the semiconductor substrate from FIG. 1 after a first epitaxial layer has been deposited.

FIG. 2 illustrates the result of a second method process in which a first silicon epitaxial layer 2 is deposited on the semiconductor substrate 1. The thickness d1 of the epitaxial layer is 600 nm, for example, and has arsenic doping with a concentration of $10^{15}$ cm$^{-3}$ (n⁻ doping), for example. Depositing the first epitaxial layer 2 buries the highly doped connection zones 10a, 10b and 10c.

Figure 3:
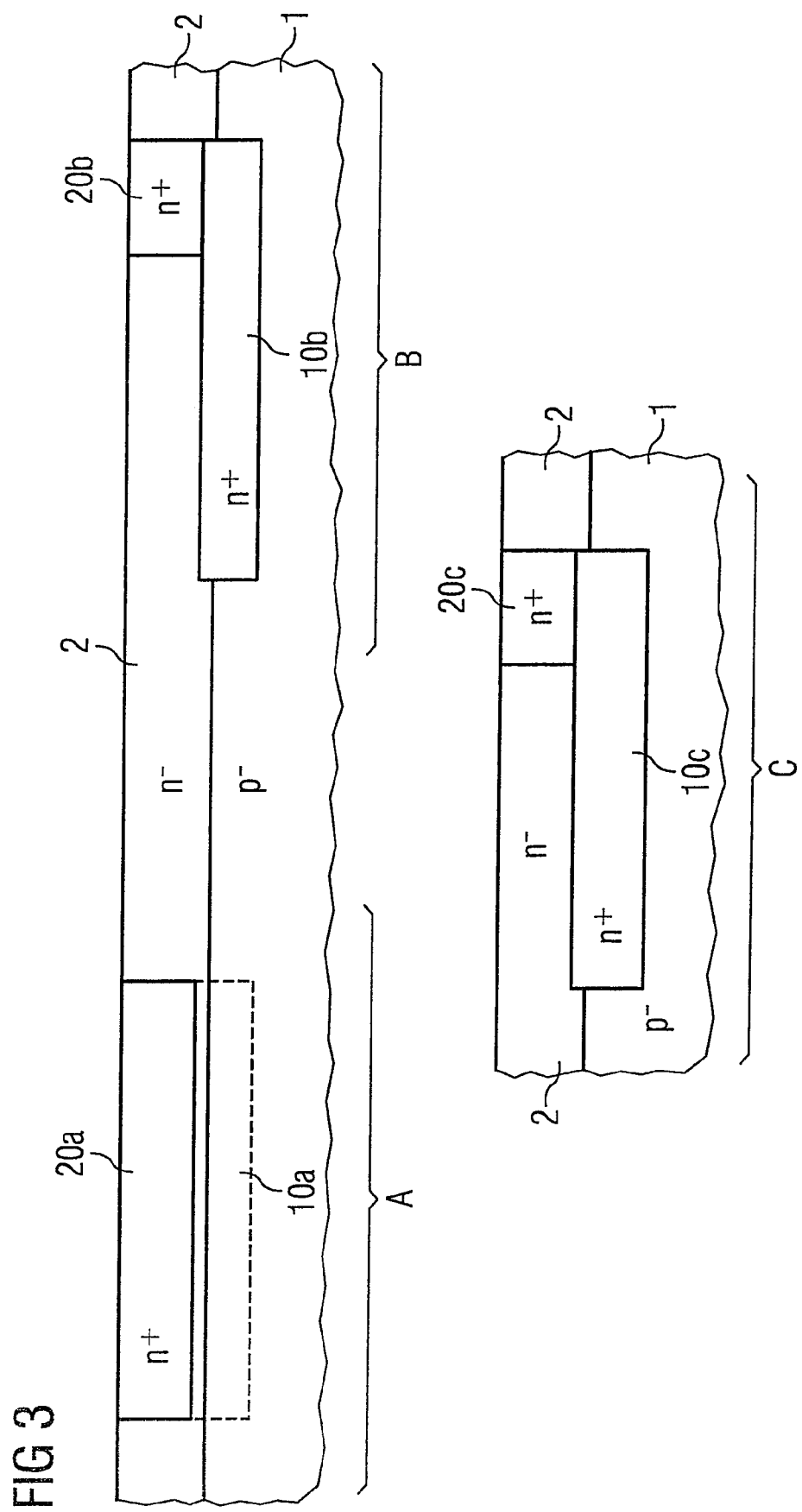
FIG. 3 illustrates the semiconductor structure from FIG. 2 with additional highly doped connection zones in the first epitaxial layer.

FIG. 3 illustrates the result of a third method process in which a further phototechnology is used to simultaneously fabricate a highly n-doped (n⁺-doped) second connection zone 20a in the component region A, a highly doped fifth connection zone 20b in the component region B and a highly doped third connection zone 20c in the component region C in the first epitaxial layer 2. This is again effected using a second arsenic implantation with a dose of $7 \cdot 10^{15}$ cm$^{-2}$, for example. The highly doped connection zone 20a is used, in the component region A of the radio-frequency transistor, as a subcollector for connecting the collector zone of the radio-frequency transistor, and the highly doped connection zones 20b and 20c are used, in the component regions B and C of the high-voltage transistor and of the capacitance diode, as a zone for contact-connecting the first highly doped connection zone 10. After the photoresist has been removed, a thermal treatment is again carried out. When the highly doped connection zone 10a is provided, it forms, together with the highly doped connection zone 20a, a "large" subcollector zone which extends over the first epitaxial layer 2 into the highly doped connection zone 10a, which is implanted in the substrate 1, and has a considerably lower connection resistance than if only the highly doped connection zone 20a were provided in the first epitaxial layer 2 as a subcollector.

Figure 4:
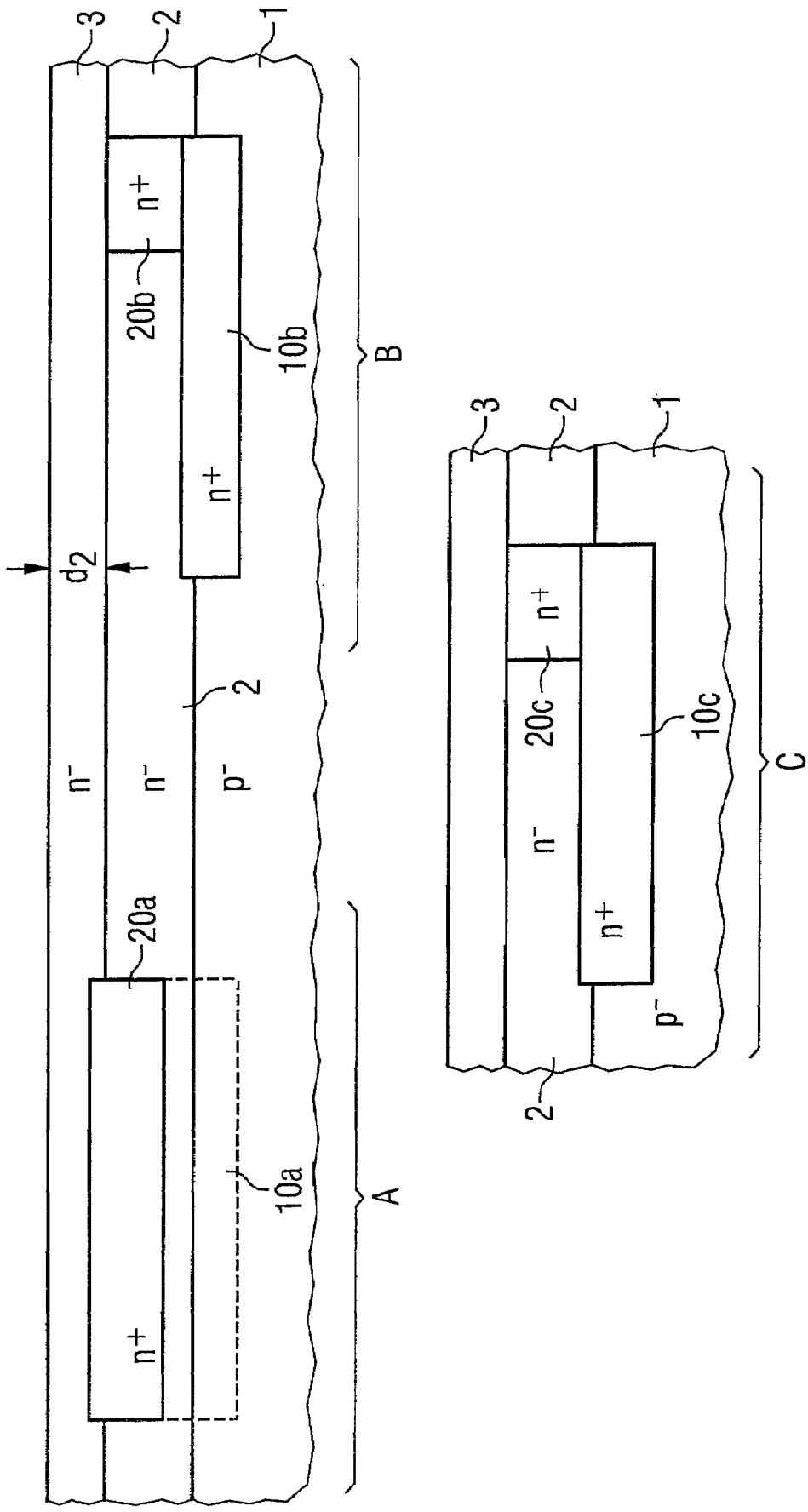
FIG. 4 illustrates the semiconductor structure from FIG. 3 in which a second epitaxial layer is also deposited above the first epitaxial layer.

FIG. 4 illustrates the result of a fourth method process in which a second silicon epitaxial layer 3 is deposited on the first epitaxial layer 2. The thickness d2 of the second epitaxial layer 3 is, for example, 150 nm and has arsenic doping with a concentration of $10^{15}$ cm$^{-3}$ (n⁻ doping), for example. The thickness d2 of the second epitaxial layer determines the collector width (d2) of the radio-frequency transistor. In contrast, the collector width of the high-voltage transistor is determined by the thickness of the first and second epitaxial layers (d1+d2). The two collector widths can thus be set independently of one another. The vertical width of the cathode zone of the capacitance diode (corresponds to the distance between the pn junction of the capacitance diode and the highly doped connection zone 10c) is likewise determined by the sum of the thicknesses (d1+d2) of the epitaxial layers 2 and 3.

On account of diffusion as a result of thermal treatments, the highly doped connection zones 10a, 10b, 10c, 20a, 20b and 20c propagate into the epitaxial layers 2 and 3, with the result that the vertical distance between the highly doped connection zone 20a and the surface of the second epitaxial layer 3, for example, is only 80 nm although the epitaxial layer itself has a thickness of 150 nm.

Figure 5:
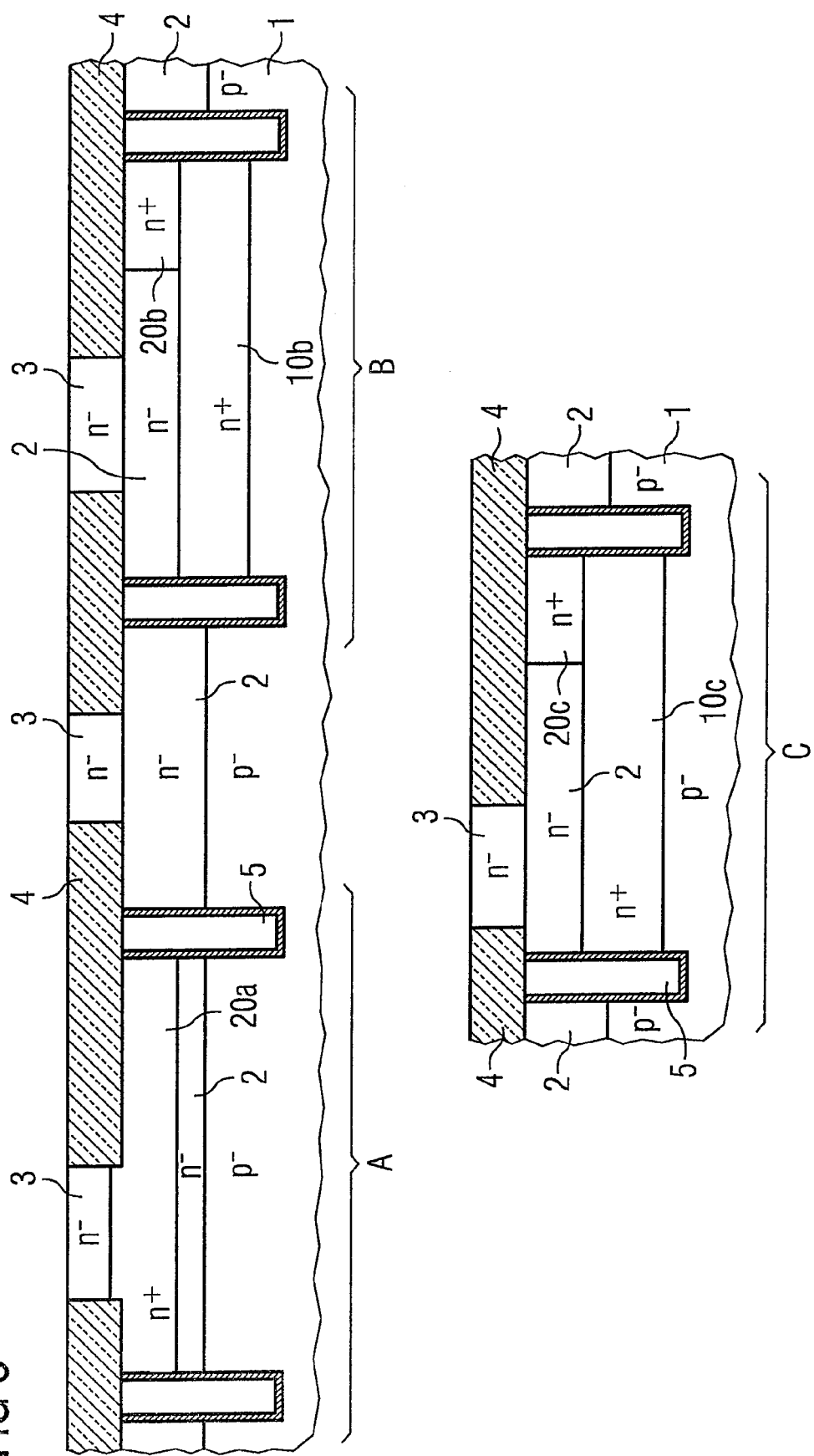
FIG. 5 illustrates the semiconductor structure from FIG. 4 in which shallow trenches which are filled with a silicon oxide layer are etched at particular locations in the second epitaxial layer. Furthermore, deep trenches are provided between the individual component regions for the purpose of insulation.

FIG. 5 illustrates the result of a fifth method process for fabricating a "deep-trench/shallow-trench" transistor isolation which is distinguished by low parasitic capacitances and high packing densities and is used in progressive bipolar and CMOS production processes. In this method step, deep trenches 5 which are filled with insulation material (for example oxide) and polysilicon and are used to insulate the components from one another are fabricated on both respective sides of the components in the component region A of the radio-frequency transistor, in the region B of the high-voltage transistor and in the component region C of the varactor. These deep trenches 5 extend, in a vertical direction, from the surface of the semiconductor structure into the weakly doped (p⁻ doped) semiconductor substrate 1. Furthermore, in this method step, shallow trenches which are filled with a silicon dioxide layer, for example by means of chemical vapor deposition (CVD) with subsequent planarization using chemical mechanical polishing (CMP), are etched in the second epitaxial layer 3. The second epitaxial layer 3 remains only locally in the component regions A, B and C of the individual components and between the component regions in order to form a substrate connection contact.

The following FIGS. 6 to 11 illustrate the method processes for fabricating the collector zones of the transistors and the cathode zone of the capacitance diode.

Figure 6:
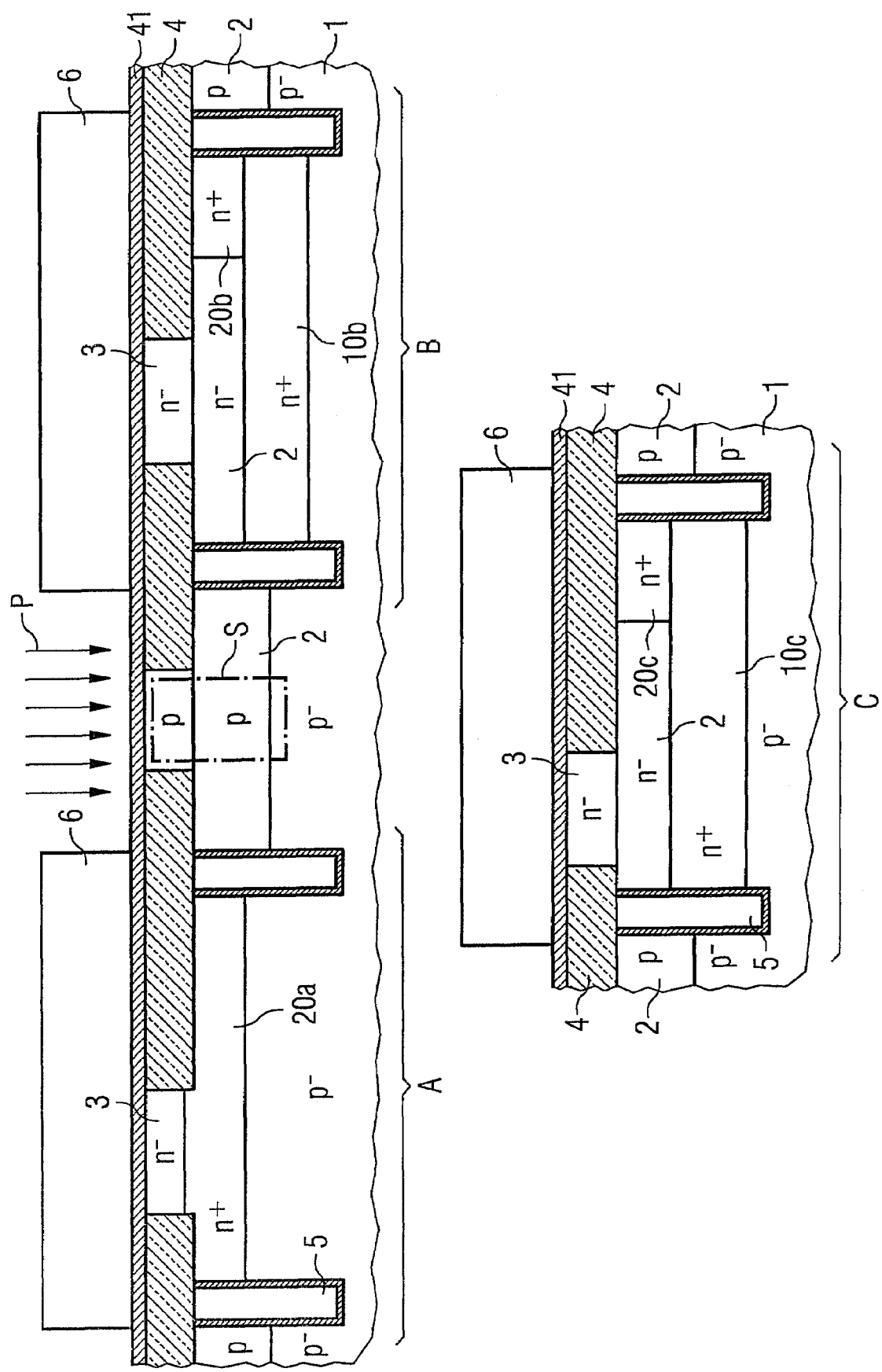
FIG. 6 illustrates the semiconductor structure illustrated in FIG. 5 with a further oxide layer and a resist mask. The first and second epitaxial layers are p-doped between the individual component regions in order to fabricate a substrate contact.

FIG. 6 illustrates the result of a sixth method process in which an oxide having a thickness of 60 nm, for example, is first of all deposited using chemical vapor deposition, for example, and is compressed using a heat treatment in the furnace. A phototechnology is used to protect the transistor and varactor regions with a resist mask 6. Substrate contacts S are then fabricated by implanting boron, for example. The substrate contacts S are situated between two component regions (A, B, C) which are bounded by trenches 5, have a doping concentration of $10^{18}$ cm$^{-3}$, for example, and extend, in a vertical direction, from the surface of the semiconductor body to the semiconductor substrate 1. The resist mask 6 is then removed.

Figure 7:
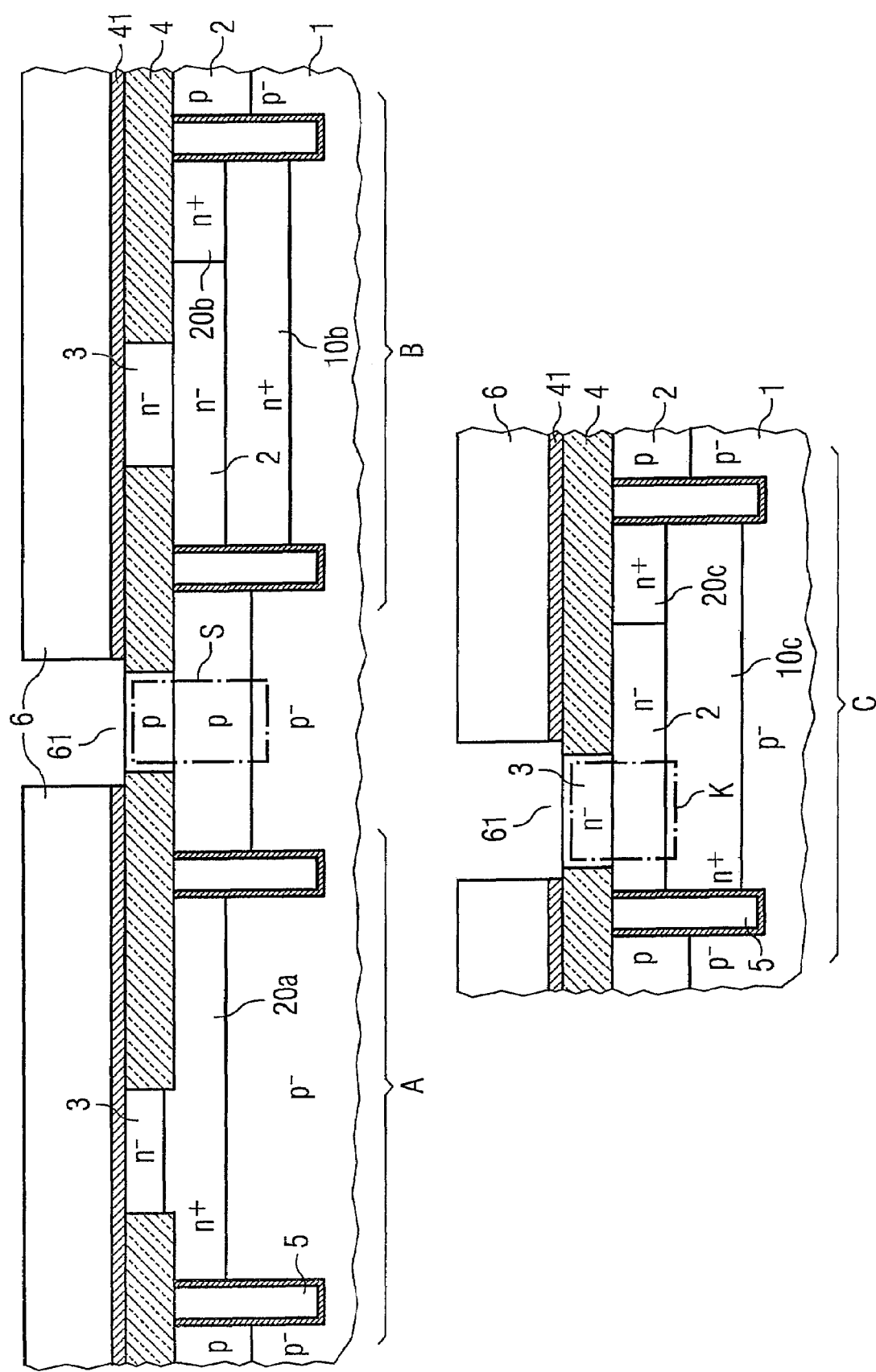
FIG. 7 illustrates the semiconductor structure from FIG. 6 with a resist mask which is interrupted in the regions of the substrate contact and in the region of the varactor. The further oxide layer is removed, at locations at which the resist mask is open, in order to expose the second epitaxial layer.

FIG. 7 illustrates the result of a further method process, wherein the oxide layer 41 is removed in the region of the substrate contact S and in the region of a cathode zone K (not yet completed) of the capacitance diode using a further phototechnology and subsequent wet etching. The resist mask 6 is then likewise removed again.

Figure 8:
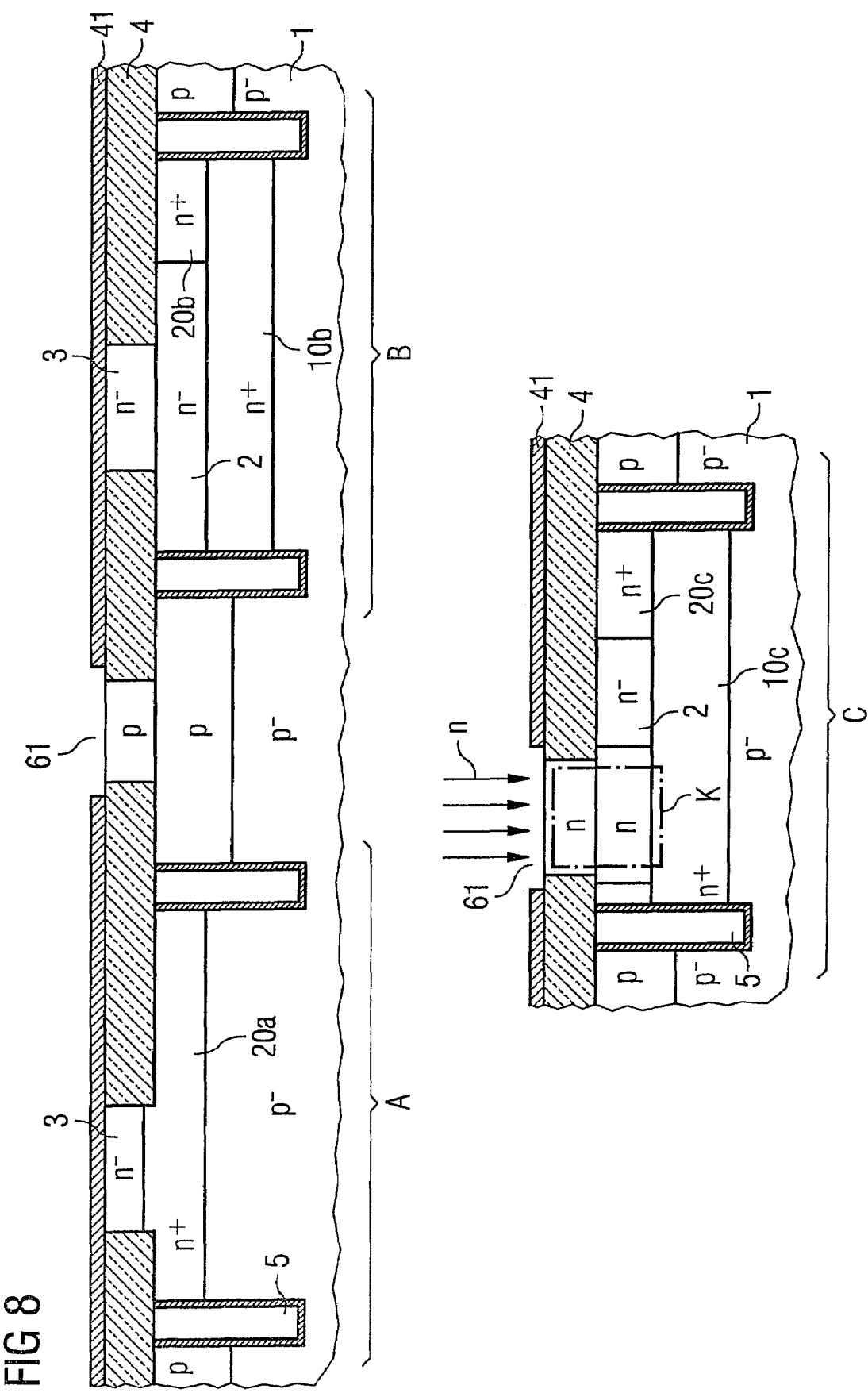
FIG. 8 illustrates the process of doping the cathode zone of the varactor diode.

In an eighth method process which is illustrated in FIG. 8, the cathode zone K of the capacitance diode is completed. In this case, the cathode zone K of the capacitance diode extends, in a vertical direction, over the first epitaxial layer 2 and the second epitaxial layer 3 and is n-doped in this method process after a screen oxide has previously been deposited with a thickness of 10 nm, for example, by means of chemical vapor deposition, for example, and a resist mask which is open only in the region of the varactor has been formed. In order to achieve the highest possible $C_{max}/C_{min}$ ratio of the capacitance diode, it is advantageous to use multiple implantation to fabricate n doping with a doping concentration that decreases toward the buried highly doped connection zone 10c. The resist mask and the screen oxide are then removed again. The screen oxide is removed, for example, by means of wet-chemical etching. The eighth method process is the only additional process needed to fabricate the capacitance diode in comparison with a fabrication method in which no capacitance diode but only a radio-frequency transistor and a high-voltage transistor are concomitantly integrated in the semiconductor substrate.

Figure 9:
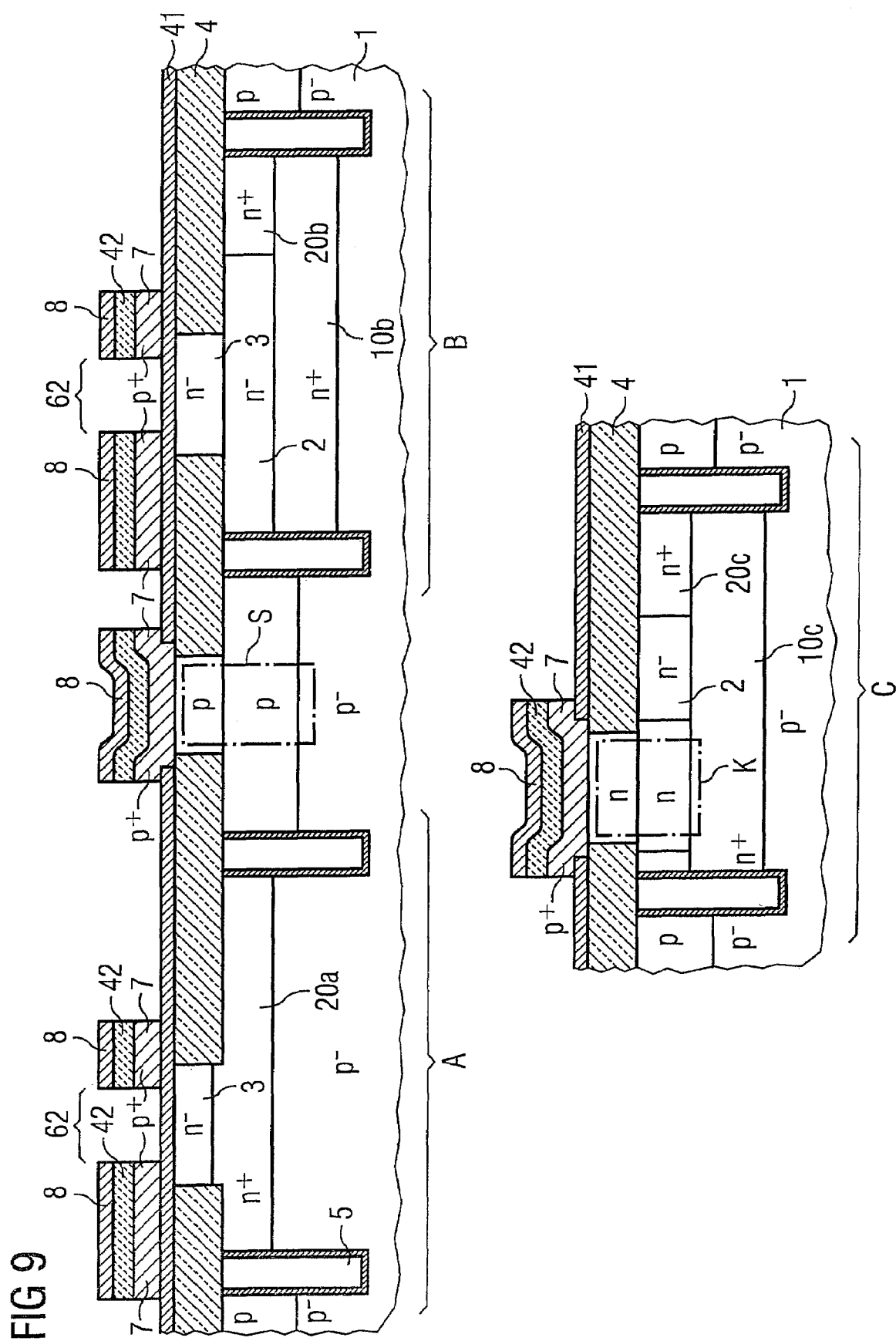
FIG. 9 illustrates the semiconductor structure from FIG. 8 which a layer stack having a polysilicon layer, an oxide layer and a nitride layer was first deposited on and was then anisotropically patterned using a phototechnology.

The result of a ninth method process is depicted in FIG. 9. A layer stack having a polysilicon layer, an oxide layer and a nitride layer is first of all formed. The polysilicon layer has a thickness of 150 nm, for example, and is heavily doped (p⁺-doped) with boron, for example. The oxide layer has a thickness of 100 nm, for example, and is fabricated using chemical vapor deposition. The thickness of the nitride layer 8 is 100 nm, for example. The layer stack is anisotropically patterned using a phototechnology. Openings 62 are thus provided in the layer stack (7, 42, 8), for example. The openings 62 define that region in which the emitter zones are subsequently arranged and are therefore also referred to as "emitter windows". The polysilicon layer 7 of the layer stack also covers the substrate contact S and the cathode zone K of the capacitance diode. In this case, the polysilicon layer 7 is used, on the one hand, to contact-connect the substrate contact and is used, on the other hand, as a highly doped (p⁺-doped) anode zone of the capacitance diode. In the region A of the radio-frequency transistor and in the region B of the high-voltage transistor, the polysilicon layer 7 is used to contact-connect the base zone which is fabricated in a subsequent method step.

Figure 10:
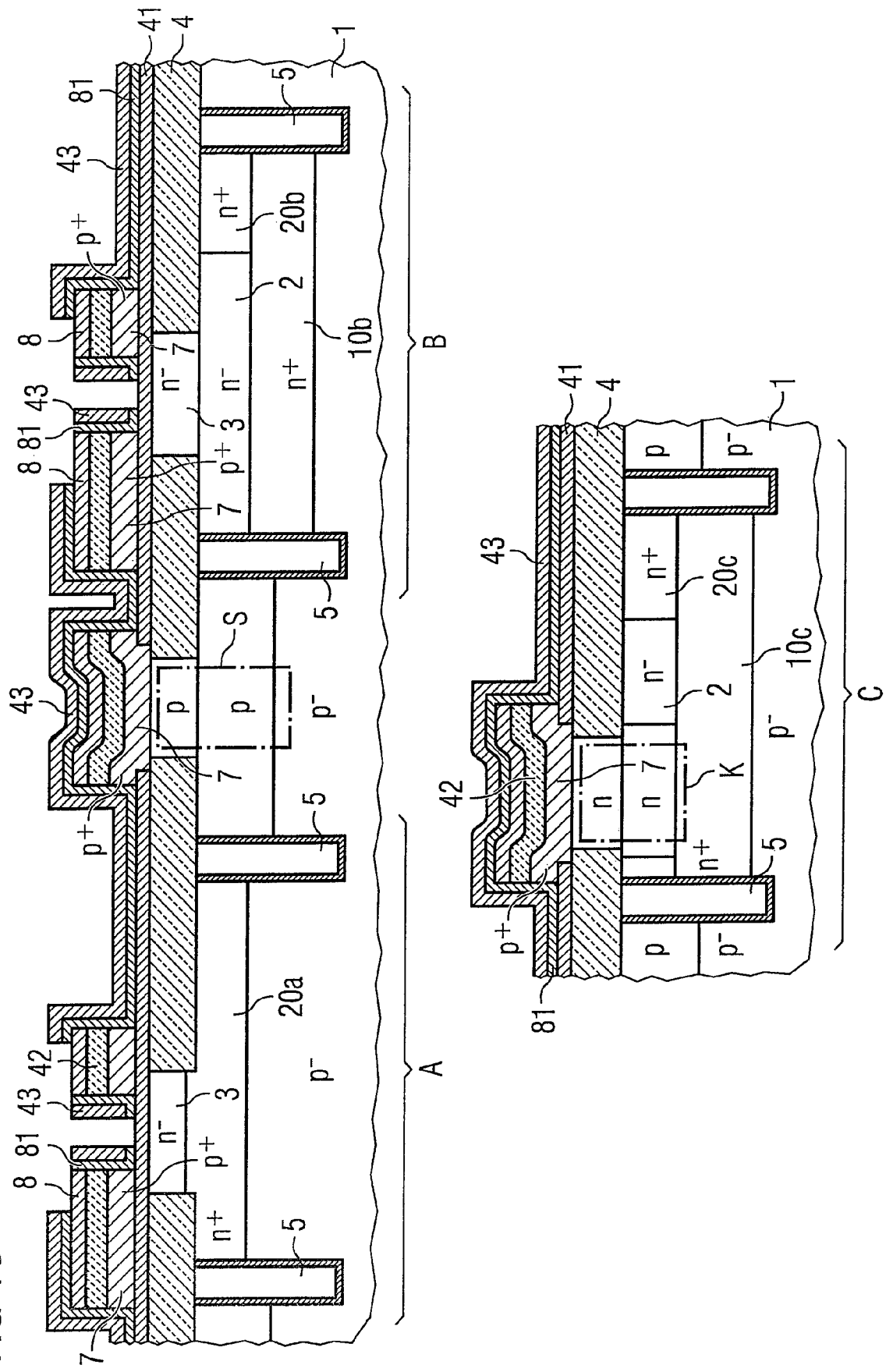
FIG. 10 illustrates the semiconductor structure from FIG. 9, wherein a nitride layer and an oxide layer, which are subsequently reopened in the regions of the transistors, are deposited on the patterned layer stack.

The result of a tenth method process is illustrated in FIG. 10. In this step, a layer stack having a nitride layer 81 having a thickness of 20 nm, for example, and an oxide layer 43 having a thickness of 70 nm, for example, is first of all arranged on the surface of the semiconductor body illustrated in FIG. 9. This layer stack (81, 43) is deposited over the whole area of the surface of the semiconductor structure. A resist mask which is open only in the regions surrounding the emitter windows of the radio-frequency transistors and of the high-voltage transistors is formed above the layer stack. Anisotropic dry etching which, in the regions which are not protected by resist, removes the oxide layer 43 having a thickness of 70 nm, for example, selectively with respect to the nitride layer 81 is subsequently carried out. However, the oxide layer 43 remains on the side walls of the emitter windows on account of the anisotropic dry etching. The resist mask is likewise then removed and the nitride layer 81 having a thickness of 20 nm is wet-chemically removed in the regions which are not covered by the oxide layer 43.

Figure 11:
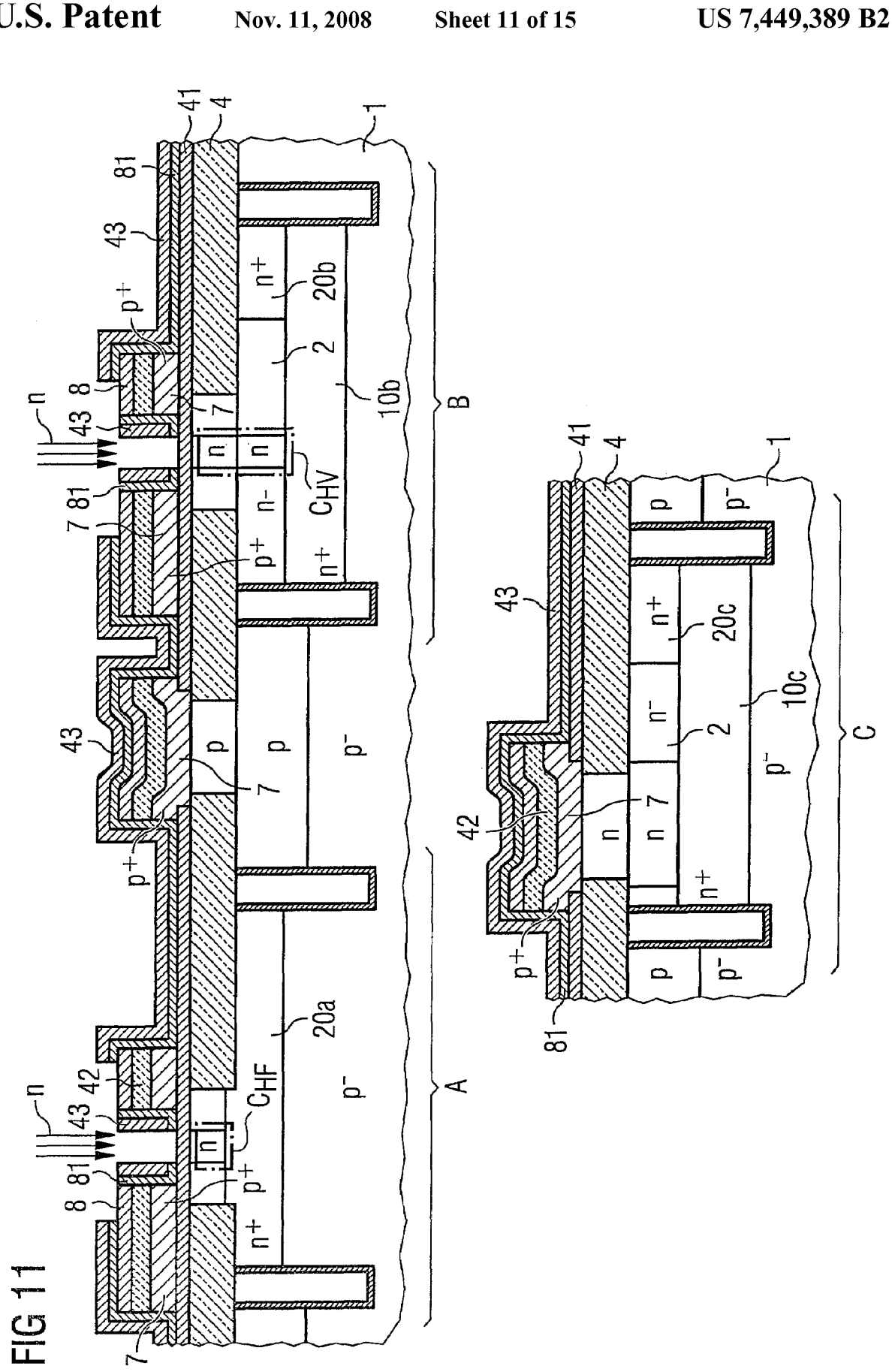
FIG. 11 illustrates the process of implanting dopants in the second epitaxial layer or—depending on the component—in the first and second epitaxial layers in order to dope the collector zones of the transistors.

FIG. 11 illustrates the implantation of dopants in order to form the collector zones of the radio-frequency transistor and of the high-voltage transistor. For this purpose, a resist mask which is open only in a region around the emitter window of the high-voltage transistor is first of all formed. The implantation for forming the n-doped collector zone $C_{HV}$ is then carried out. The doping concentration of the collector zone $C_{HV}$ is, for example, $2 \cdot 10^{16}$ cm$^{-3}$. The resist mask is then removed and the more highly n-doped collector zone $C_{HF}$ of the radio-frequency transistor is implanted in a corresponding manner with the aid of a further resist mask. The doping concentration of the collector zone $C_{HF}$ is, for example, $10^{18}$ cm$^{-3}$. This method process concludes the formation of the collector zones.

Figure 12:
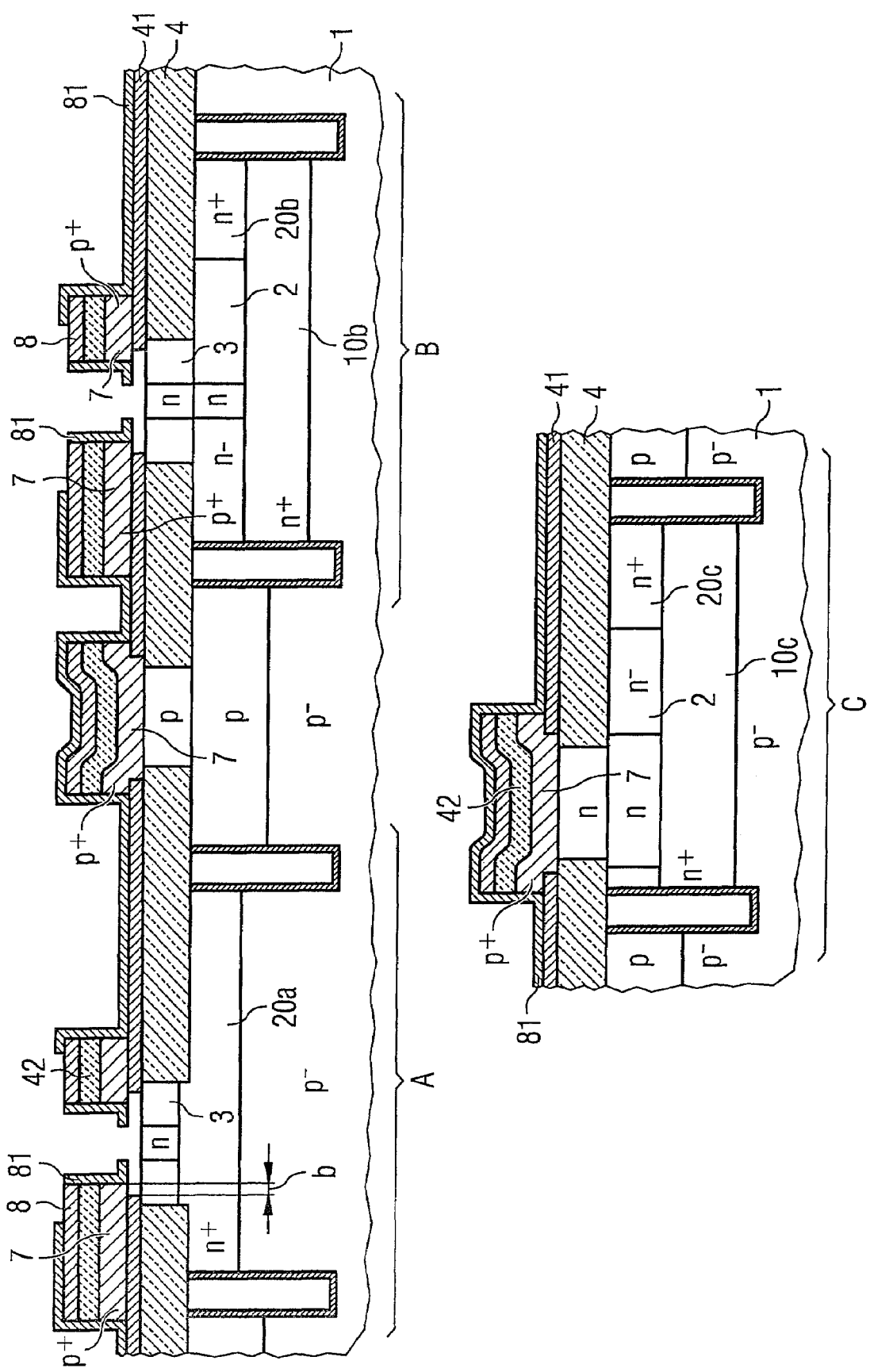
FIG. 12 illustrates the semiconductor structure from FIG. 11 after the oxide layer has been removed in the collector regions of the transistors.

In a twelfth method process whose result is illustrated in FIG. 12, the oxide layers 43 and 41 are removed, in the regions which are not protected by a nitride layer, using wet etching. Isotropic etching is carried out until an overhang b of the polysilicon layer 7 of approximately 80 nm is fabricated, i.e. the oxide layer 41 between the polysilicon layer 7 and the second epitaxial layer 3 is etched back until an overhang of the polysilicon layer 7 of 80 nm is fabricated.

Figure 13:
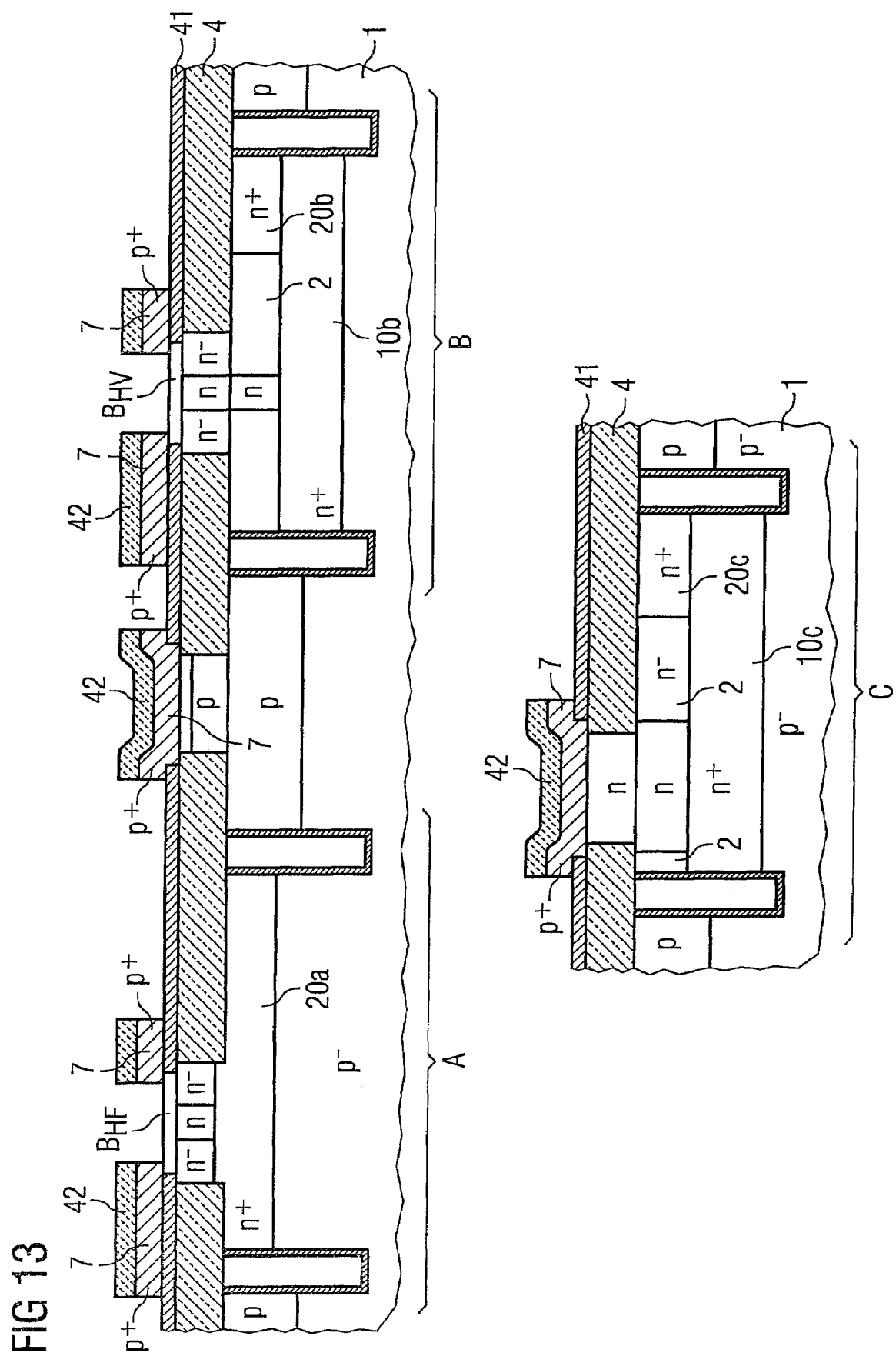
FIG. 13 illustrates the semiconductor structure from FIG. 12 after the SiGe base has been applied in the region of the transistors and the nitride layer has subsequently been removed.

In a thirteenth method process (see FIG. 13), the p+-doped silicon/germanium base zone of the radio-frequency transistor and of the high-voltage transistor $B_{HF}$ and $B_{HV}$ is deposited only on the exposed silicon and polysilicon regions using selective epitaxy. During selective epitaxy in the p+-doped SiGe base, carbon is preferably also incorporated with a concentration of $10^{18}$ cm$^{-3}$ to $5 \cdot 10^{20}$ cm$^{-3}$ in order to largely avoid the diffusion of the boron items during the subsequent process. The base zones B are selectively deposited until low-resistance contact with the exposed part of the p+-doped polysilicon layer 7, which is used as a connection zone for the base, is achieved. All of the nitride layers (8, 81) are then removed selectively with respect to the oxide with the aid of phosphoric acid.

Figure 14:
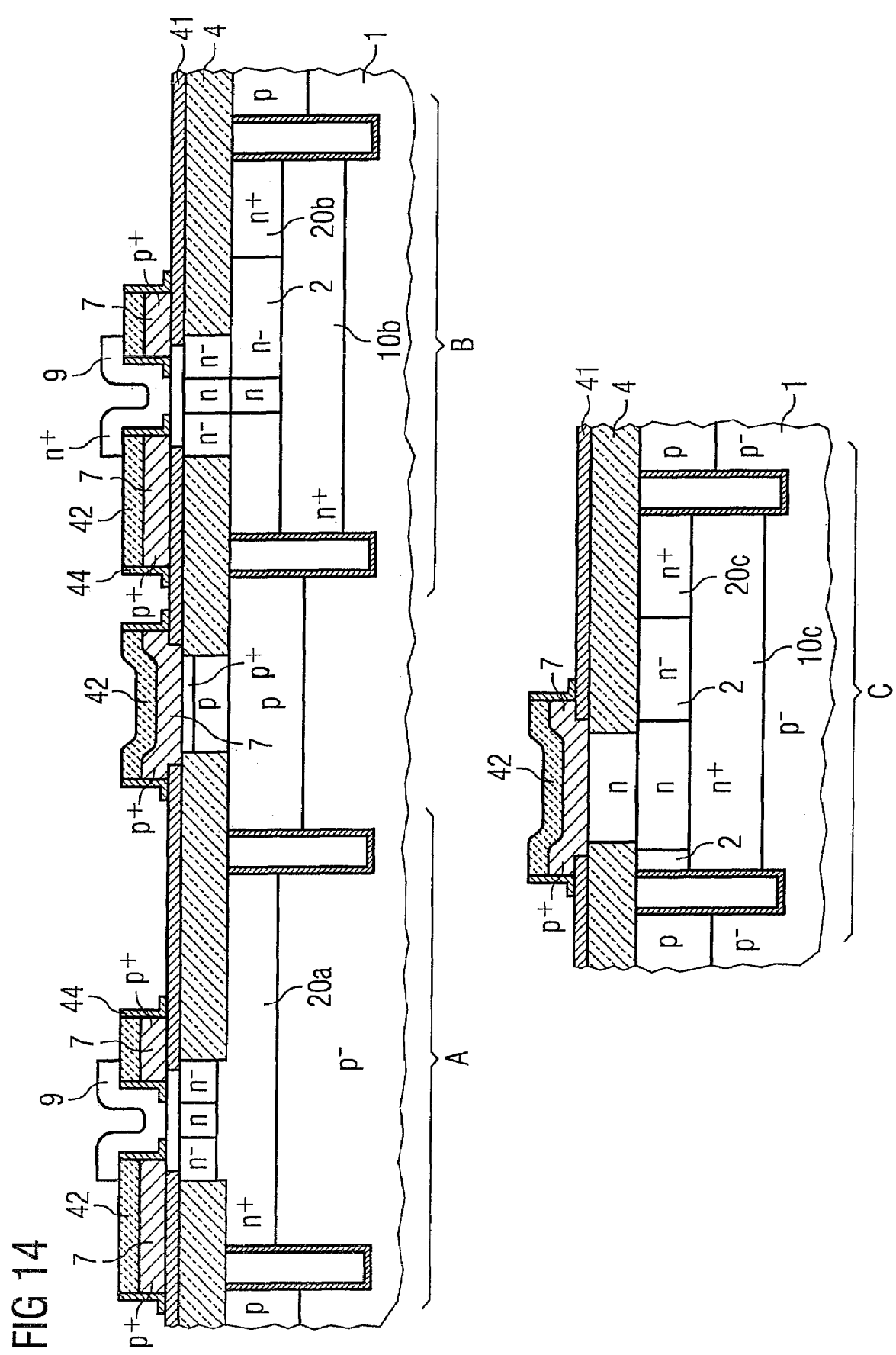
FIG. 14 illustrates the semiconductor structure from FIG. 13 after the highly doped emitter zones have additionally been fabricated.

In a fourteenth method process, emitter zones 9 of the radio-frequency transistor and of the high-voltage transistor are fabricated. The result of this method process is illustrated in FIG. 14. oxide spacers 44 are first of all deposited on the side walls of the emitter windows; in this case, the spacers are thin oxide layers which cover the oxide layer 42 and the polysilicon 7 only in a vertical plane. Emitter layers 9 are then deposited in the region of the emitter windows by means of differential epitaxy, for example. In this case, the emitter layer grows in the exposed silicon regions in a monocrystalline manner and in the oxide regions in a polycrystalline or amorphous manner.

Figure 15:
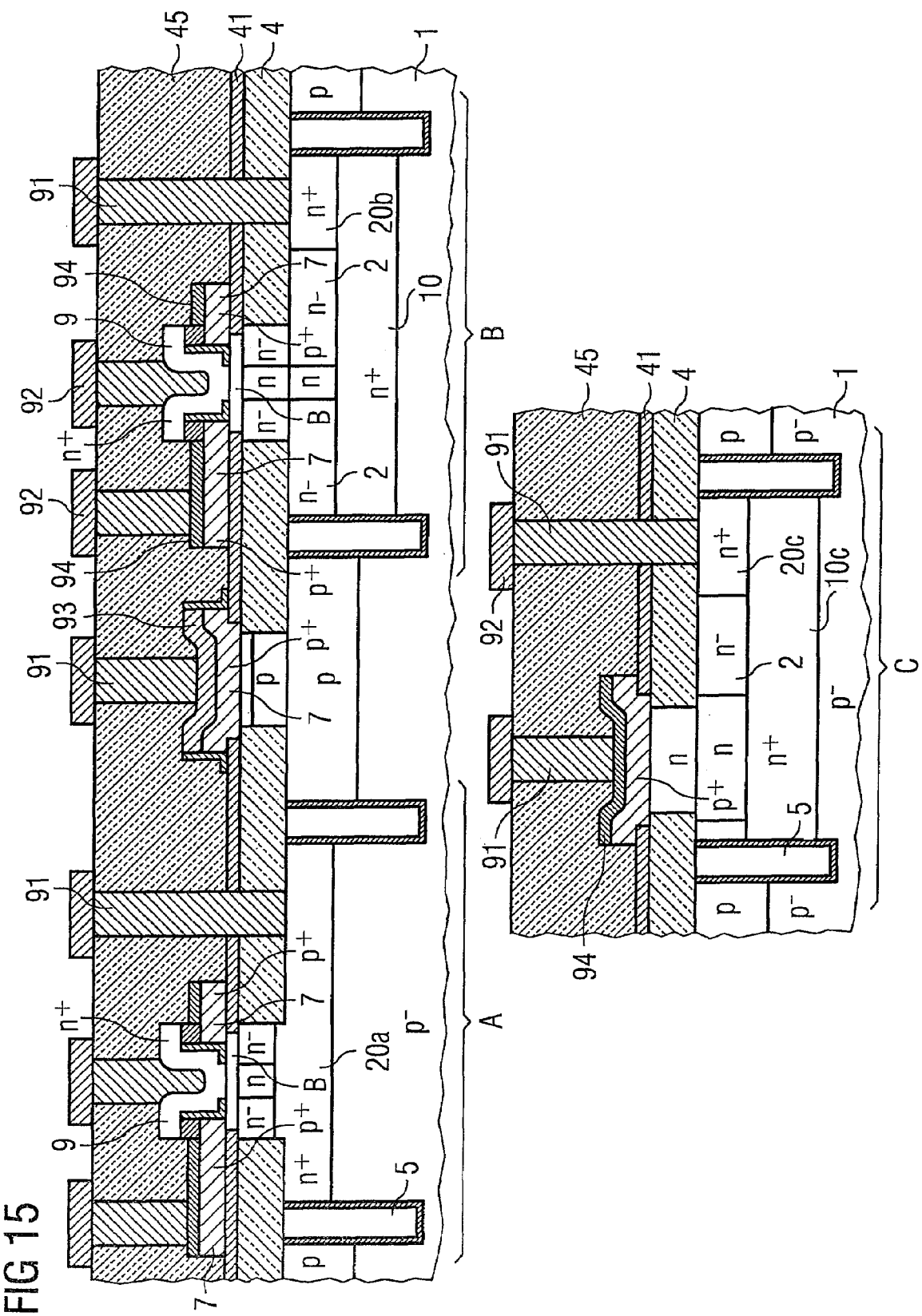
FIG. 15 illustrates the completed semiconductor chip. It differs from the semiconductor structure illustrated in FIG. 14 by virtue of the fact that tungsten connection contacts have additionally been provided for the base, the emitter and the collector of the transistors, for the substrate contact and for the anode and cathode of the capacitance diode.

In a final method process, the oxide layer 42 is removed above the polysilicon layer 7 and a silicide layer 94 is applied to the exposed regions of the polysilicon layer 7. Silicon oxide 45 is then deposited and planarized using chemical mechanical polishing (CMP), with the result that an intermediate oxide layer having a thickness of 1500 nm, for example, is fabricated. FIG. 15 illustrates the semiconductor structure with the radio-frequency transistor $T_{HF}$, the high-voltage transistor $T_{HV}$ and the capacitance diode $D_V$ at the end of the process. In this case, contact holes which are filled with tungsten are also provided for the purpose of contact-connecting the buried highly doped connection zones 20a, 20b and 20c of the emitter zones 9 and of the silicide layer 94 which, in turn, contact-connects the base zones $B_{HF}$ and $B_{HV}$ of the transistors and the anode of the capacitance diode via the polysilicon layer 7. The tungsten in the contact holes 91 is connected to lines 92 which connect the individual devices to an electronic circuit.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor comprising:
    defining a first component region and a second component region in a semiconductor body;
    forming a first epitaxial layer through the first component region and the second component region;
    forming a second epitaxial layer over the first epitaxial layer, including configuring the physical dimensions of a first active zone of the first component region independent of a second active zone of the second component region via the first epitaxial layer and the second epitaxial layer;
    forming a radio-frequency transistor in the first component region;
    forming a varactor in the second component region,
    defining the first active zone to be a collector zone of the radio-frequency transistor; and
    defining the second active zone to be a cathode zone of the varactor;
    determining a collector width of the radio-frequency transistor by a thickness of the second epitaxial layer; and
    determining a cathode width of the varactor by the first epitaxial layer and the second epitaxial layer.

2. The method of claim 1, comprising:
    implanting dopants into the second component region in order to form the cathode zone of the varactor; and
    implanting dopants in the first component region in order to form the collector zone of the radio-frequency transistor.

3. The method of claim 1, wherein the cathode width is determined by a sum of the width of the first epitaxial layer and the width of the second epitaxial layer.

4. A method for fabricating component zones of a radio-frequency transistor, which is arranged in a first component region of a semiconductor body, and of a varactor, which is arranged in a second component region of a semiconductor body, the method comprising:
    providing a semiconductor substrate;
    fabricating a first highly doped connection zone in the semiconductor substrate in the second component region;
    fabricating a first semiconductor layer on the semiconductor substrate;
    fabricating a second highly doped connection zone in the first semiconductor layer in the first component region;
    fabricating a third highly doped connection zone in the first semiconductor layer in the second component region, the third highly doped connection zone being at least partially formed above the first highly doped connection zone;
    fabricating a second semiconductor layer on the first semiconductor layer;
    implanting dopants into the second component region in order to form a cathode zone of the varactor, the cathode zone extending, in a vertical direction, as far as the first connection zone; and
    implanting dopants in the first component region in order to form a collector zone of the radio-frequency transistor, the collector zone extending, in a vertical direction, as far as the second connection zone.

5. The method of claim 4, comprising wherein a sixth highly doped connection zone is fabricated in the first component region in the semiconductor substrate.

6. The method of claim 4, comprising fabricating component zones of a high-voltage transistor in a third component region, wherein a fourth highly doped connection zone is fabricated in the third component region in the semiconductor substrate, a fifth highly doped connection zone is fabricated in the third component region in the first semiconductor layer, the third highly doped connection zone being at least partially formed above the first highly doped connection zone, dopants are implanted in the third component region in order to form a collector zone of the high-voltage transistor, the collector zone extending, in a vertical direction, as far as the fourth highly doped connection zone.

7. The method of claim 6, in which fabricating the third highly doped connection zone is carried out before fabricating the second semiconductor layer.

8. The method of claim 6, wherein the third and/or the fifth highly doped connection zone(s) is/are fabricated in the first and the second semiconductor layers in the process of fabricating the third highly doped connection zone after the process of fabricating the second semiconductor layer.

9. The method of claim 6, in which the process of fabricating the third highly doped connection zone and fabricating the second semiconductor layer are carried out simultaneously.

10. The method of claim 4, wherein the semiconductor layers are epitaxial layers.

11. The method of claim 4, having the following additional method processes after fabricating the second semiconductor layer and before implanting dopant into the second component region:
    fabricating deep trenches which extend from the surface of the second semiconductor layer into the semiconductor substrate;
    filling the deep trenches at least partially with an insulation material;
    fabricating shallow trenches in the second epitaxial layer; and
    filling the shallow trenches with insulation material.

12. The method of claim 11, wherein silicon oxide is used as insulation material.

13. The method of claim 12, comprising the additional process of depositing a further oxide layer on the second epitaxial layer.

14. The method of claim 13, comprising:
    implanting dopants into the first and the second epitaxial layers in regions between the component regions in order to fabricate a substrate contact; and
    opening the further oxide layer in the region of the substrate contact and in the second component region.

15. The method of claim 14, comprising:
    depositing a layer stack comprising a polysilicon layer, an additional oxide layer and a nitride layer, the polysilicon layer adjoining the cathode zone of the varactor and thus forming an anode zone of the varactor, and the polysilicon layer adjoining the substrate contact; and
    removing selectively the layer stack in the first and the third component regions above the collector zones.

16. The method of claim 15, comprising:
    following implantation in order to form the collector zones and the cathode zones;
    removing the further oxide layer in the region above the collector zones;
    depositing a SiGe base zone on each of the exposed collector zones; and
    depositing an emitter zone on the base zones.

* * * * *